United States Patent
Chang et al.

[11] Patent Number: 6,046,475
[45] Date of Patent: Apr. 4, 2000

[54] STRUCTURE AND METHOD FOR MANUFACTURING DEVICES HAVING INVERSE T-SHAPED WELL REGIONS

[75] Inventors: Kow-Ming Chang; Ji-yi Yang; Ming-Ray Mao, all of Hsinchu, Taiwan

[73] Assignee: National Science Council, Taiwan

[21] Appl. No.: 08/864,988

[22] Filed: May 29, 1997

[30] Foreign Application Priority Data

Dec. 24, 1996 [TW] Taiwan ................................. 85115989

[51] Int. Cl.[7] ................................................ H01L 31/119
[52] U.S. Cl. .......................... 257/345; 257/371; 257/400
[58] Field of Search .................................. 257/336, 344, 257/345, 361, 362, 371, 372, 375, 376, 394, 400, 408, 409

[56] References Cited

U.S. PATENT DOCUMENTS

| | | | |
|---|---|---|---|
| 4,784,968 | 11/1988 | Komori et al. | 437/41 |
| 4,868,620 | 9/1989 | Kohl et al. | 357/23.12 |
| 5,060,033 | 10/1991 | Takeuchi | 357/23.4 |
| 5,177,570 | 1/1993 | Tanaka | 257/345 |
| 5,466,957 | 11/1995 | Yuki et al. | 257/344 |
| 5,605,855 | 2/1997 | Chang et al. | 437/45 |
| 5,608,253 | 3/1997 | Liu et al. | 257/365 |
| 5,757,045 | 5/1998 | Tsai et al. | 257/336 |
| 5,841,171 | 11/1998 | Iwamatsu et al. | 257/347 |

*Primary Examiner*—Sara Crane
*Attorney, Agent, or Firm*—Townsend and Townsend and Crew LLP

[57] ABSTRACT

A structure for manufacturing devices having inverse T-shaped well regions, which are formed on a substrate, comprises a first doped region and second doped region which have higher impurity concentrations and two third doped regions which have a lower impurity concentration. The first doped region formed on the substrate by a high-energy ion-implantation process is kept at a predetermined distance from the surface of the substrate. The second doped region extends from the surface of the substrate toward the downside to connect to the first doped region, such that two third doped regions are formed. The second doped region is formed by an ion-implantation process through an opening of a mask. Furthermore, a gate is formed above the second doped region, and source and drain regions are formed on the substrate. Therefore, a device having an inverse T-shaped well region is completely fabricated.

16 Claims, 19 Drawing Sheets

STRUCTURE AND METHOD FOR MANUFACTURING DEVICES HAVING INVERSE T-SHAPED WELL REGIONS

BACKGROUND OF THE INVENTION

1. Field of the Invention

The invention relates to a semiconductor process, and in particular to a structure and method for manufacturing devices having inverse T-shaped well regions.

2. Description of the Invention

Currently, development of the semiconductor IC process is trending towards extremely high density, wherein well-known MOS devices are fabricated by use of a deep sub-micron technology. The integrated circuits (ICs) which are manufactured under the appropriate circumstances in a process can avoid poor performance and can efficiently operate under normal conditions in line with the shrinkage of device sizes. Taking the above-mentioned MOS devices as an example, the entire design should be re-adjusted due to the shrinkage of the geometry structure, wherein a well region process is one of necessary approaches for manufacturing the MOS device in accord with the trend of miniaturization. Since punchthrough is often encountered and more precisely aligned MOS devices are required after MOS devices have been shrunk in size, the MOS devices are being manufactured by use of a well region process so as to meet the requirements of device specifications.

FIGS. 1 through 3 and FIGS. 4 through 6 illustrate two methods for manufacturing two conventional well structures.

Referring to FIG. 1, first, a lightly-doped diffusion region 12 is formed on a substrate 10 by an ion implantation process to define a well region. Since the part except for the formed well region is covered with a protective layer (not shown), the part mentioned above can not be affected by the ion-implantation process.

Next, two field oxide layers 14 are formed on the substrate 10 by an oxidation process or a trench-insulating technology, as shown in FIG. 2. The isolating oxide layers may also be formed by a trench-filling process. Therefore, the well region and its internal device region can be defined. Then, as shown in FIG. 3, the well region 16 is re-implanted by using the field oxide layers 14 as a mask to form a new impurity concentration distribution providing threshold voltage re-adjustment and punchthrough voltage control.

Referring to FIG. 4, there is shown a substrate 20 on which field oxide layers 22 for defining a device region are formed. As shown in FIG. 5, the substrate 20 is implanted with high energy to form a strip-shaped well region 24. The parts under field oxide layers 22 have a shallow impurity distribution and lighter concentration. Finally, referring to FIG. 6, the impurity concentration of the well region 28 is increased by another ion-implantation process, thereby adequately adjusting and controlling the threshold voltage.

However, the well region formed by the two processes mentioned above cannot avoid various problems caused by the re-shrinkage of devices. For example, when a gate oxide becomes thinner and the distance between a source and drain is reduced, a leakage current may exist between the gate and the source or drain, or between the drain and another electrode, such that power consumption is increased and accuracy of a logic operation is affected, even though the device is not at an on-state. In addition, since the ratio of channel length to the overlapping regions among the source, drain and gate is decreased, parasitic capacitance is increased and operational speed is slow. Furthermore, hot electron effect is easily encountered affecting the reliability of the devices, when the voltage on a channel is increased as the channel becomes shorter. In addition, the shallow junction structure adopted for preventing the narrow channel effect increases parasitic resistance. These problems await resolution.

In the first conventional well region process, since the implantation time and drive-in time for forming the entire well region are too long and the field oxide layers are formed after a channel stop implantation process, the narrow channel effect is readily encountered. Thus, the first conventional well region process is not suitable for manufacturing deep sub-micron devices. As for the second conventional process, since only field oxides are used as a mask for implantation, the impurity distributions under the gate and source/drain are the same, thus being not able to prevent various problems caused by device shrinkage. Consequently, the problems resulting from the conventional processes, such as current leakage, parasitic capacitance, and parasitic resistance, and even latch-up effect, must be overcome by a new approach and structure.

SUMMARY OF THE INVENTION

In view of the above, the invention provides devices having inverse T-shaped well regions for the requirements of the deep sub-micron process to eliminate adverse factors including parasitic capacitance and parasitic resistance.

Furthermore, the process for forming inverse T-shaped well regions according to the invention is easily performed, thus making deep sub-micron device manufacturing more feasible.

A structure and method for manufacturing devices having inverse T-shaped well regions according to the invention can correspond with various drain structures, such that the IC design becomes more flexible.

Moreover, a structure and method for manufacturing devices having inverse T-shaped well regions help to increase the current-carrying capacity for tiny devices, reduce power consumption, increase operational speed and enhance reliability, thereby improving the quality and operational efficiency of the devices.

The devices having inverse T-shaped well regions disclosed by the invention formed on a substrate comprise a first doped region, a second doped region and two third doped regions. The first doped region is formed on the substrate and keeps a predetermined distance from the surface of the substrate. The second diffusion extends from the surface of the substrate toward the downside until it connects to the first doped region. The third doped region is formed between the surface of the substrate and the first doped region, and is spaced by the second doped region. In addition, the impurity concentration of the third doped region is lower than those of the first and second doped regions.

The method for manufacturing devices having inverse T-shaped well regions comprises the following steps. Field oxide layers are formed on a substrate to define device regions. Next, a first doped region is formed on the substrate by an ion-implantation process, wherein the first doped region keeps a predetermined distance from the surface of the substrate. After that, a mask is formed on the surface of the substrate, and then a second doped region is formed in the substrate through the opening of the mask by an ion-implantation process, wherein the second doped region extends from the surface of the substrate toward the downside until it connects to the first doped region. The regions that have not been ion implanted are divided by the formed second doped region into two third doped regions.

BRIEF DESCRIPTION OF THE DRAWINGS

The present invention will become more fully understood from the detailed description given hereinbelow and the accompanying drawings, which are provided for illustration of preferred embodiments only and should not be construed as limiting the scope of the present invention, and wherein.

DETAILED DESCRIPTION OF THE INVENTION

Figure 1:
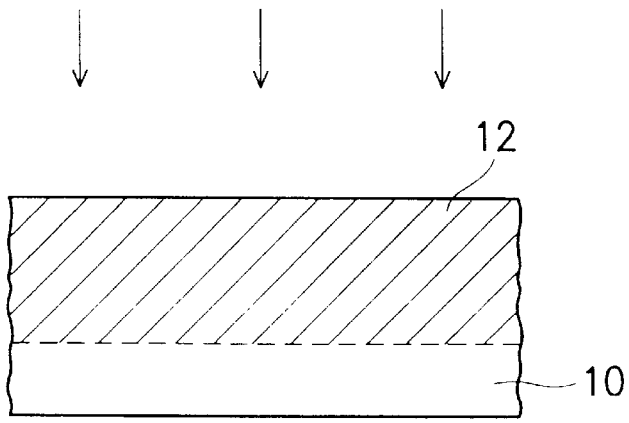
FIGS. 1 through 3 are cross-sectional views illustrating a method for manufacturing a conventional well region.
Figure 2:
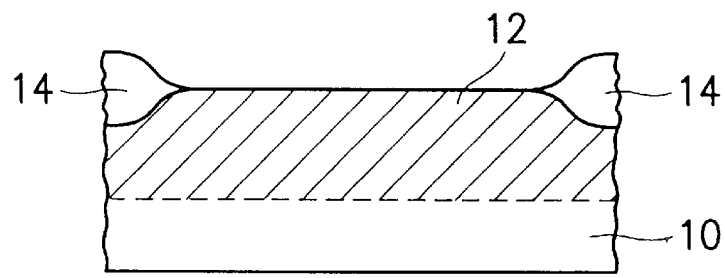
Figure 3:
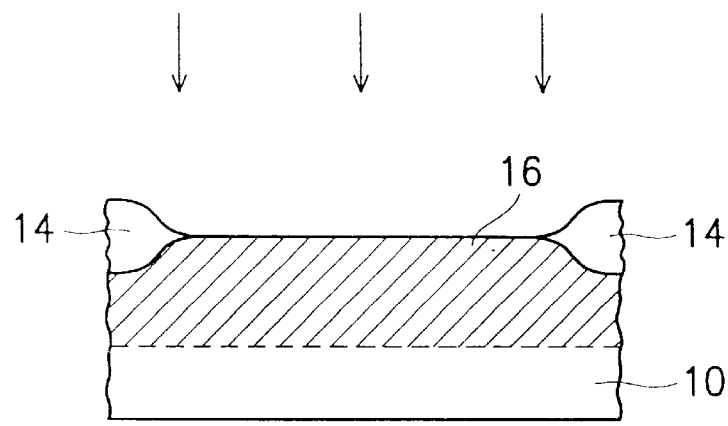
Figure 4:
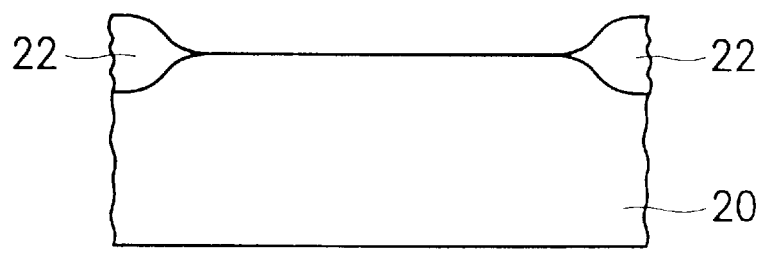
FIGS. 4 through 6 are cross-sectional views illustrating a method for manufacturing another conventional well region.
Figure 5:
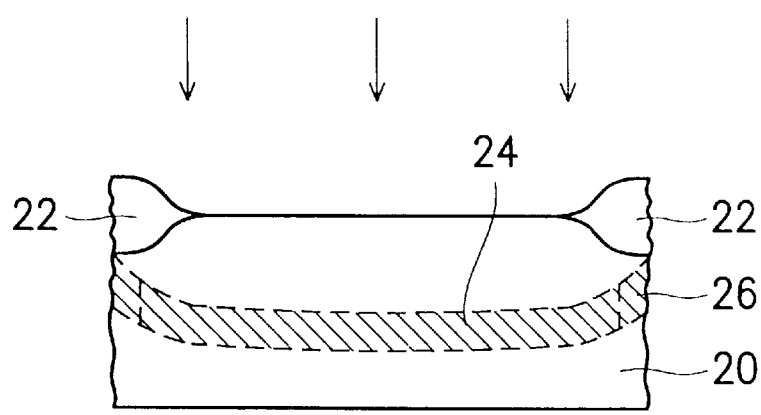
Figure 6:
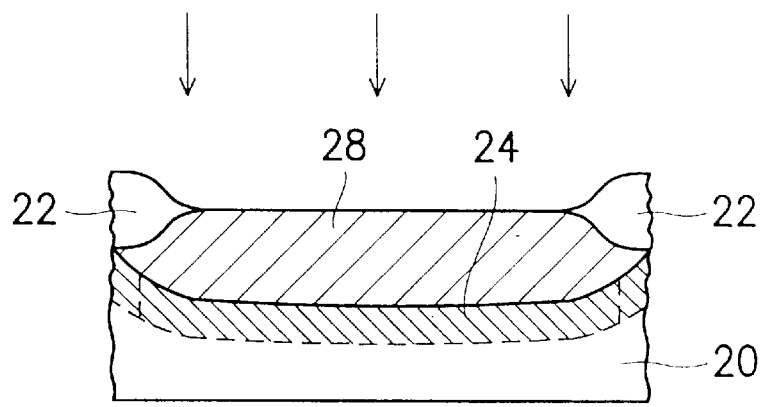
Figure 7:
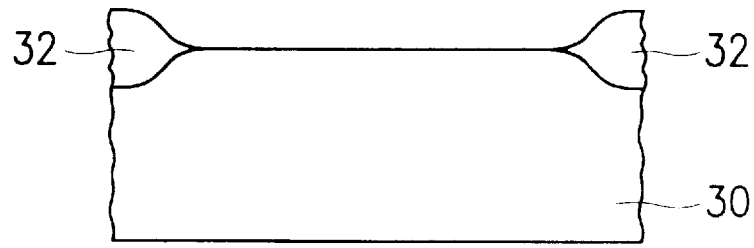
FIGS. 7 through 10 are cross-sectional views showing a method for manufacturing devices having inverse T-shaped well regions according to a first embodiment of the invention.
Figure 8:
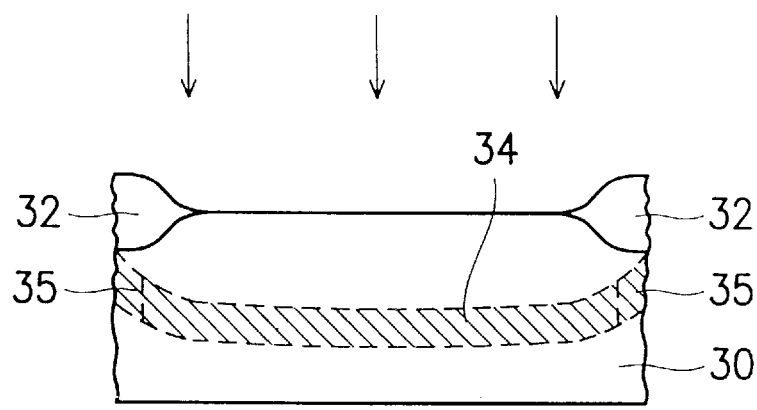

FIGS. 7 through 10 are cross-sectional views illustrating a method for manufacturing devices having inverse T-shaped well regions according to a preferred embodiment of the invention. First, field oxide layers 32 are formed on a substrate 30 by a well-known LOCOS process as shown in FIG. 7. Next, a heavily doped first doped region 34 is formed in the substrate by an ion-implantation process to define a well region. Since the first doped region must be kept at a predetermined distance from the surface of the substrate 30 as shown in FIG. 8, the above-mentioned ion-implantation process should have a high energy and high impurity concentration. Moreover, the type of the well region depends on the type of implanted impurity. In addition, parts of the doped region 35 under the field oxide layers 32 are shallow and have a lower impurity concentration.

Figure 9:
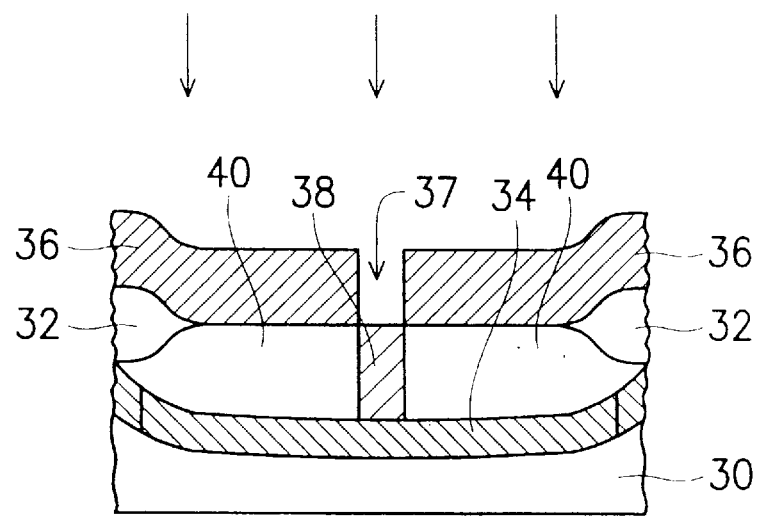

After that, a mask for defining an implanting pattern is formed on the substrate 30 as shown in FIG. 9. That is, a photoresist layer 36 having an opening 37 is formed on the substrate 30, then forming a second doped region 38 beneath the opening 37 by an ion-implantation process. The second doped region 38 extends from the surface of the substrate toward the downside until it connects to the first doped region 34. Therefore, the regions that have not been ion implanted (that is, the regions covered by the photoresist layer 36) are spaced by the formed second doped region 38 into two third doped regions 40. At this point, an inverse T-shaped well region is formed in the substrate 30, wherein the first doped region 34 is the head of the T fond and the second doped region is the tail of the T fond. Both the first doped region 34 and second doped region 38 have a higher impurity concentration than the third doped region.

The second doped region 38 of the inverse T-shaped well region located under a subsequently-formed gate is used for threshold voltage adjustment and punchthrough voltage control. Taking a silicon substrate as an example, the original impurity concentration of the substrate is about $10^{15}/cm^3$ (generally, $10^{10}$–$10^{16}/cm^3$). Also, the impurity concentration of the third doped region 40 is about $10^{15}/cm^3$. The impurity concentrations of the first doped region 34 and second doped region 38 depend on the specifications of the devices. For example, in a 0.17 µm process, the impurity concentrations of the first doped region 34 and second doped region 38 can be as high as $10^{18}/cm^3$, wherein the impurity concentration of the substrate is about $10^{15}/cm^3$ such that the manufactured devices can have a better performance. Generally, in a 0.35 µm gate having a nitride oxide layer process, it is better to keep the impurity concentration of the second doped region 38 in a range of $5 \times 10^{16}$–$5 \times 10^{18}/cm^3$. If the ate is a high dielectric material, the impurity concentration of the second doped region can be much higher.

Figure 10:
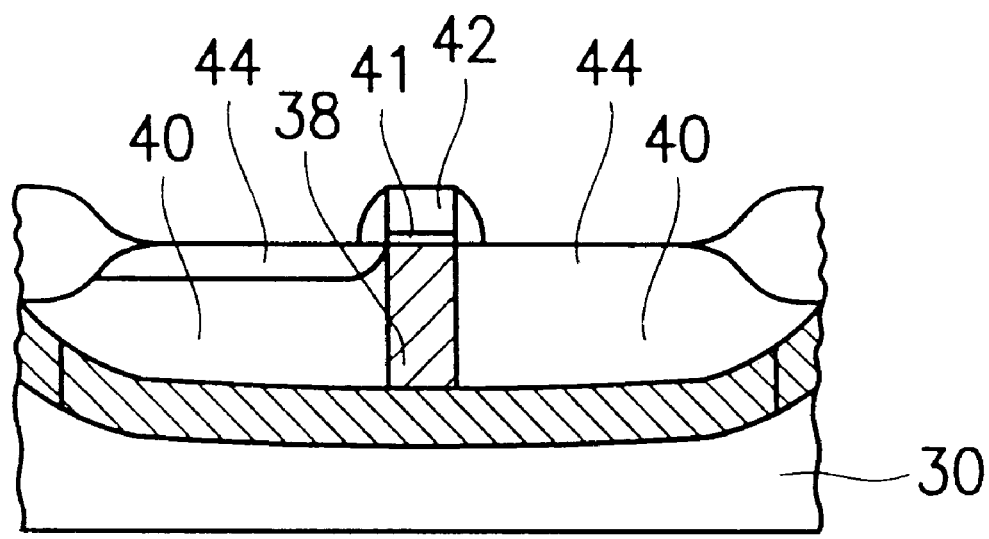

In the structure as shown in FIG. 9, a device can be fabricated on the inverse T well region based on a normal process, for example, forming a gate oxide layer 41, depositing a polysilicon layer 42, implanting, annealing, defining a gate structure, forming spacers, forming a source and drain 44, etc. in order on the substrate, after removing the photoresist layer 36. Therefore, an MOS device can be fabricated on the inverse T-shaped well region as shown in FIG. 10.

Figure 11A:
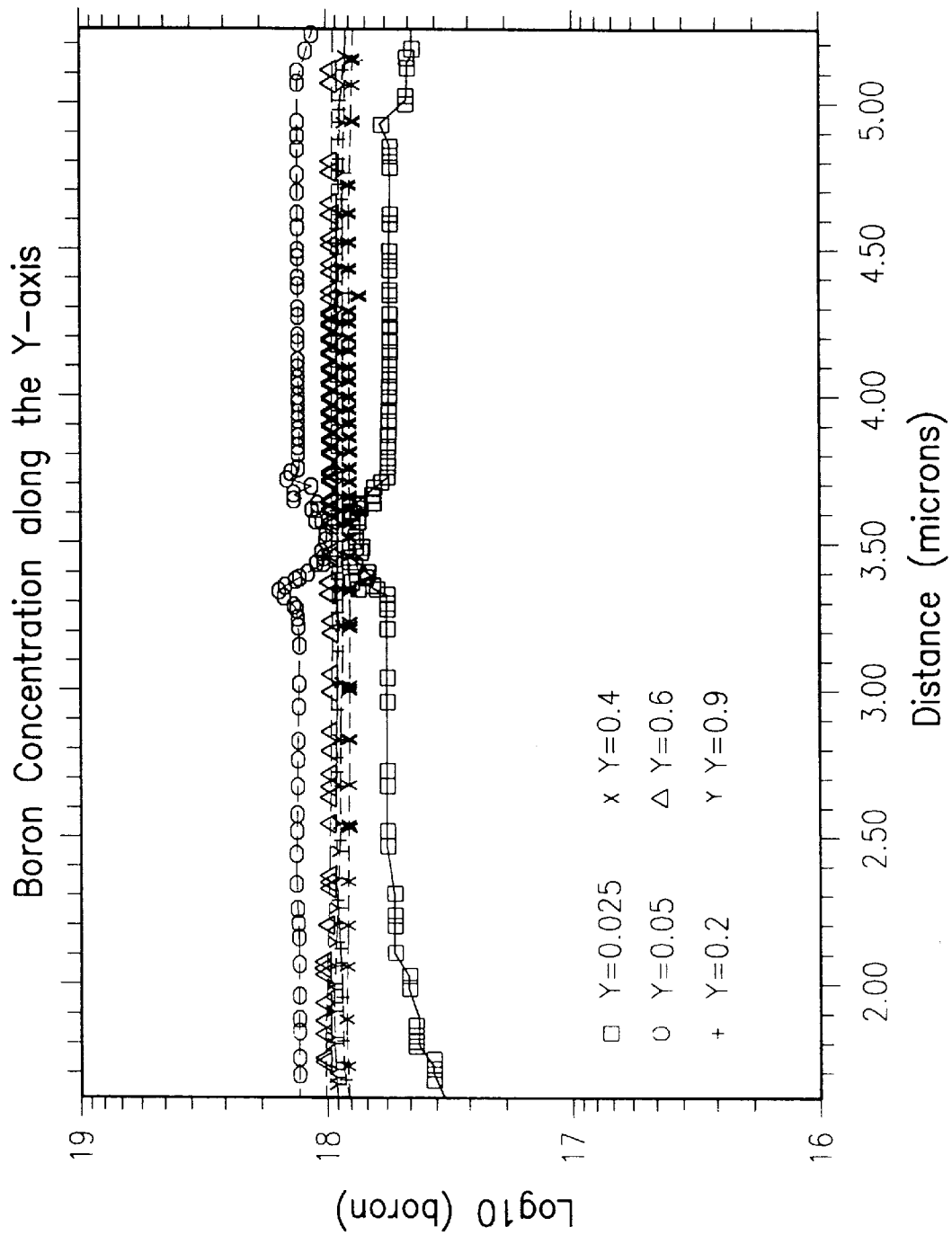
FIGS. 11A through 18B are graphs showing the comparisons in impurity concentration and various electrical properties between the conventional well region devices and the devices having inverse T-shaped well regions, wherein FIGS. 11A, 12A, . . . and 18A describe the conventional well region devices, while the FIGS. 11B, 12B, . . . and 18B describe the devices having inverse T-shaped well regions according to the invention.
Figure 11B:
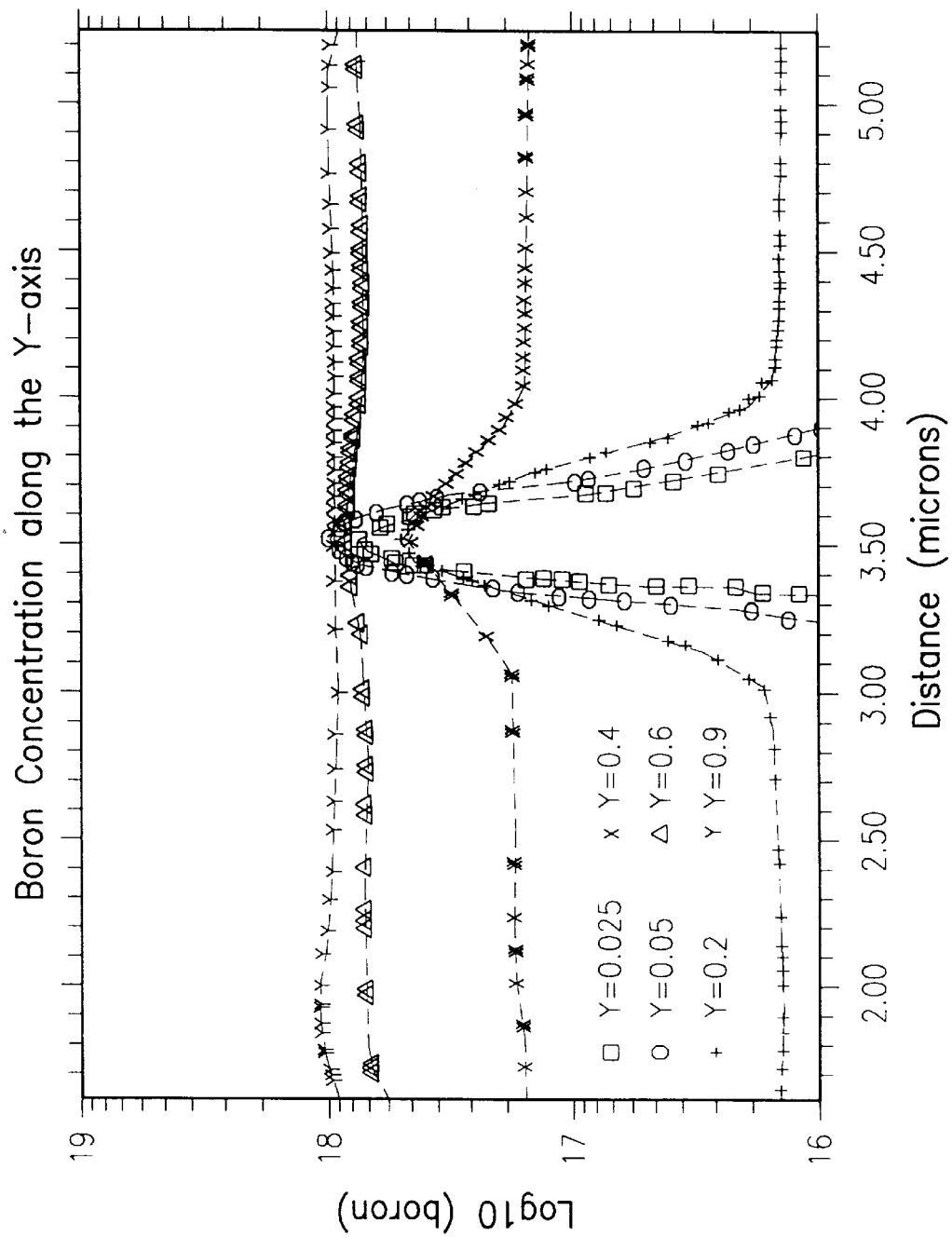

Now, a device having an inverse well region according to the invention and a device having a conventional well region device are manufactured by a 0.17 µm process of computer simulation and then are compared to each other in structure and electrical properties (0.35 µm), thereby making the advantages of the invention clearer. First, the boron concentration distribution of the conventional well region as shown in FIG. 11A is compared with that of the inverse T-shaped well region according to the invention as shown in FIG. 11B. In FIGS. 11A and 11B, different reference numerals represent different depths of concentration distributions. As shown in FIG. 11A, all lines are located around the concentration of $10^{18}/cm^3$. However, in FIG. 11B, the concentration distribution of the entire inverse T-shaped well region is shown, wherein the more shallow the line is, the more concentrated the corresponding concentration is. As can be learned from FIG. 11A, since the effective impurity is affected by the compensation between the P-type and N-type, parasitic resistance is increased, even though the amount of impurity has been increased. However, in the structure of the invention, since the drain engineering part cannot be affected by electrical compensation and the effective impurity quantity is the same as that of the drain engineering part, the parasitic resistance is reduced and the saturation current is increased.

Figure 12A:
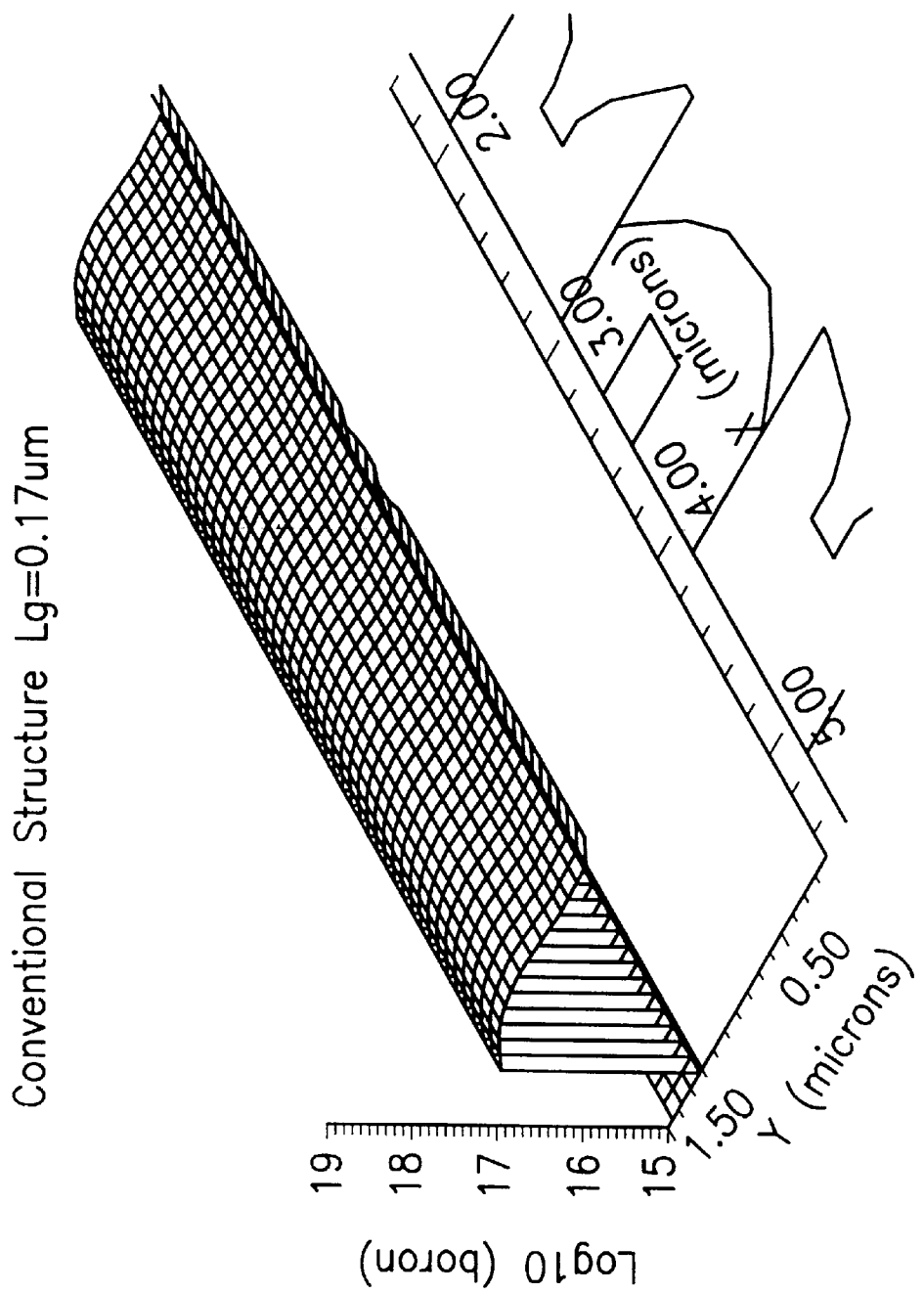
Figure 12B:
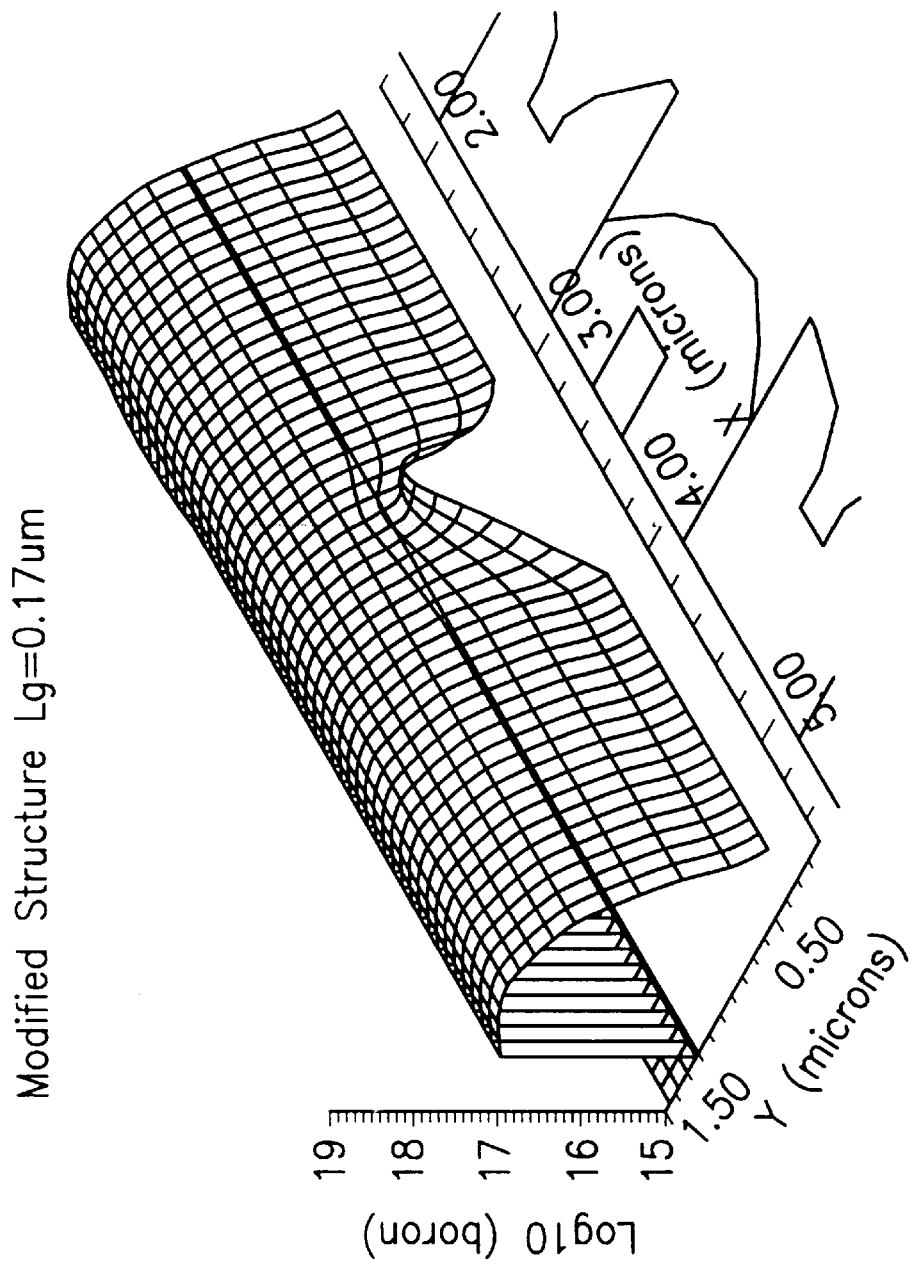
Figure 13A:
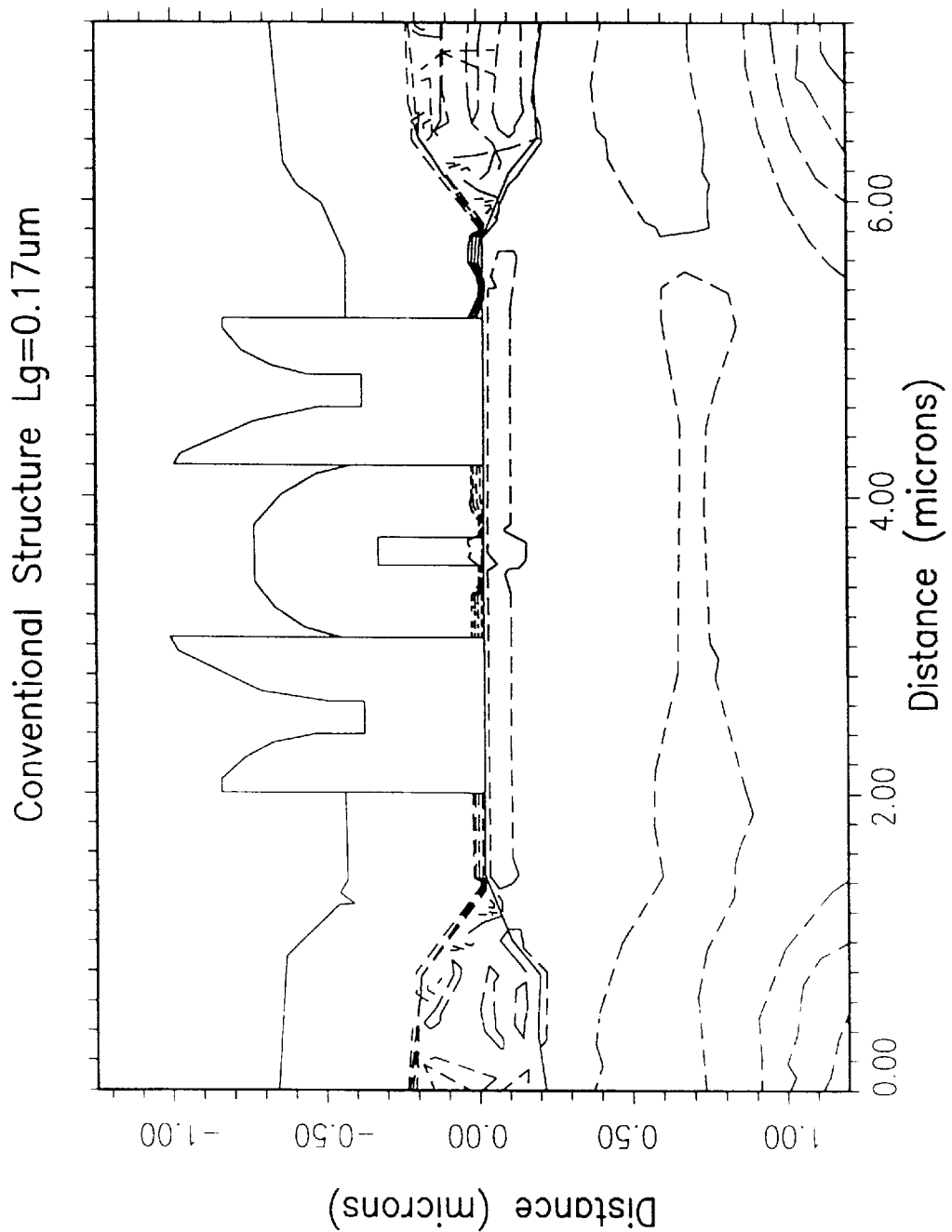
Figure 13B:
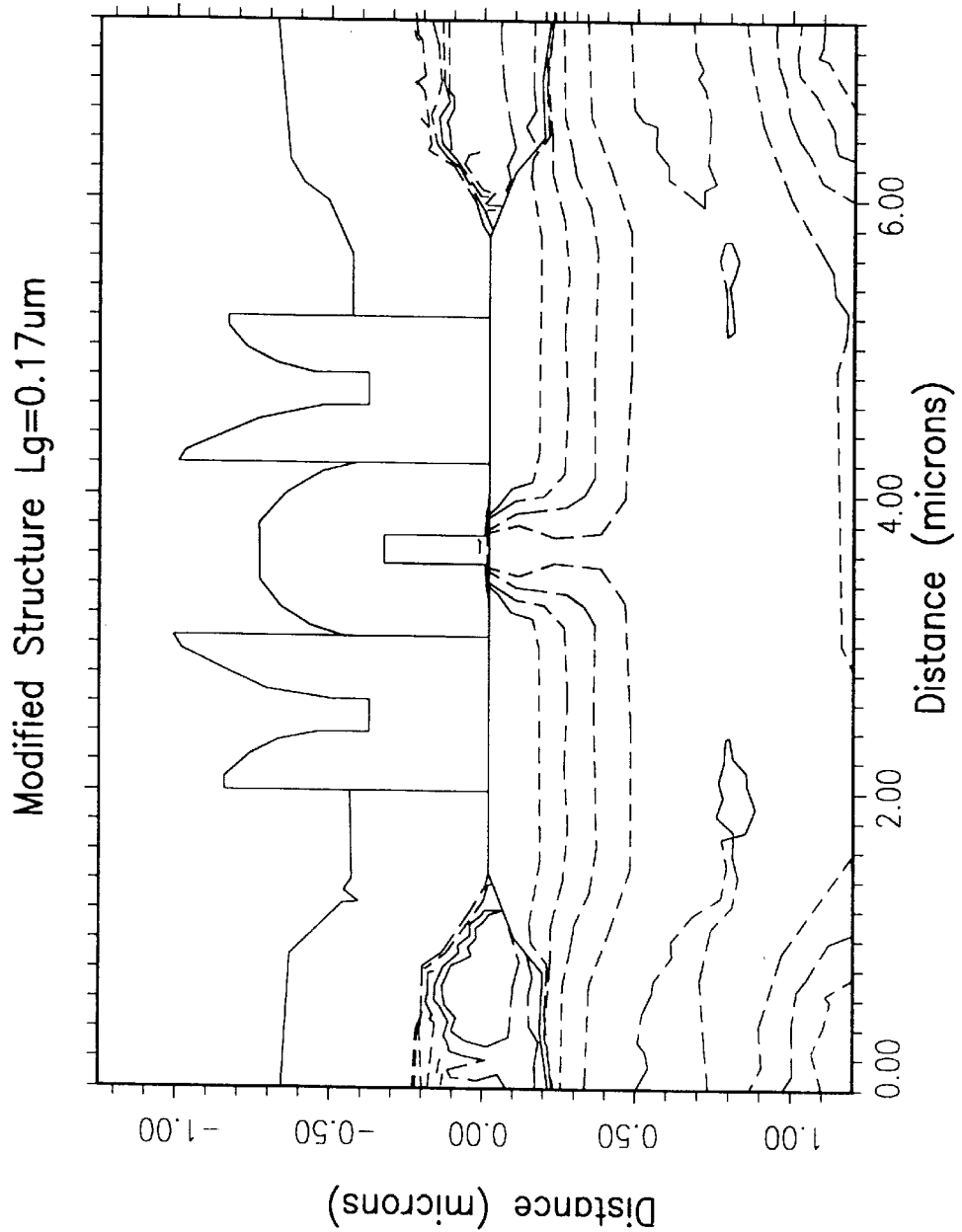

FIGS. 12A and 12B are 3D graphs of FIGS. 11A and 11B showing the concentration distributions. FIG. 13A and FIG. 13B are cross-sectional views showing the concentration distributions according to the prior art and the invention, respectively.

Figure 14A:
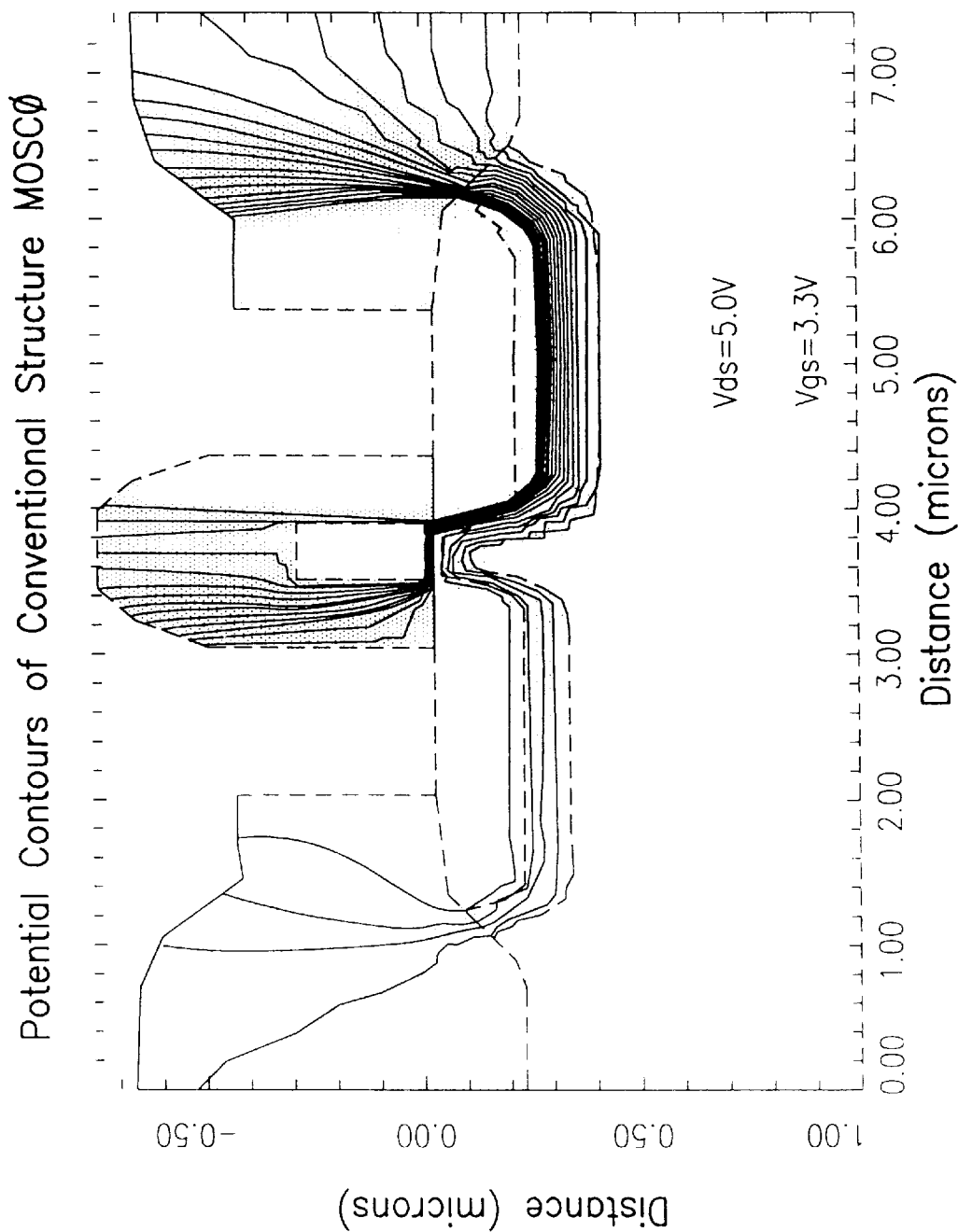
Figure 14B:
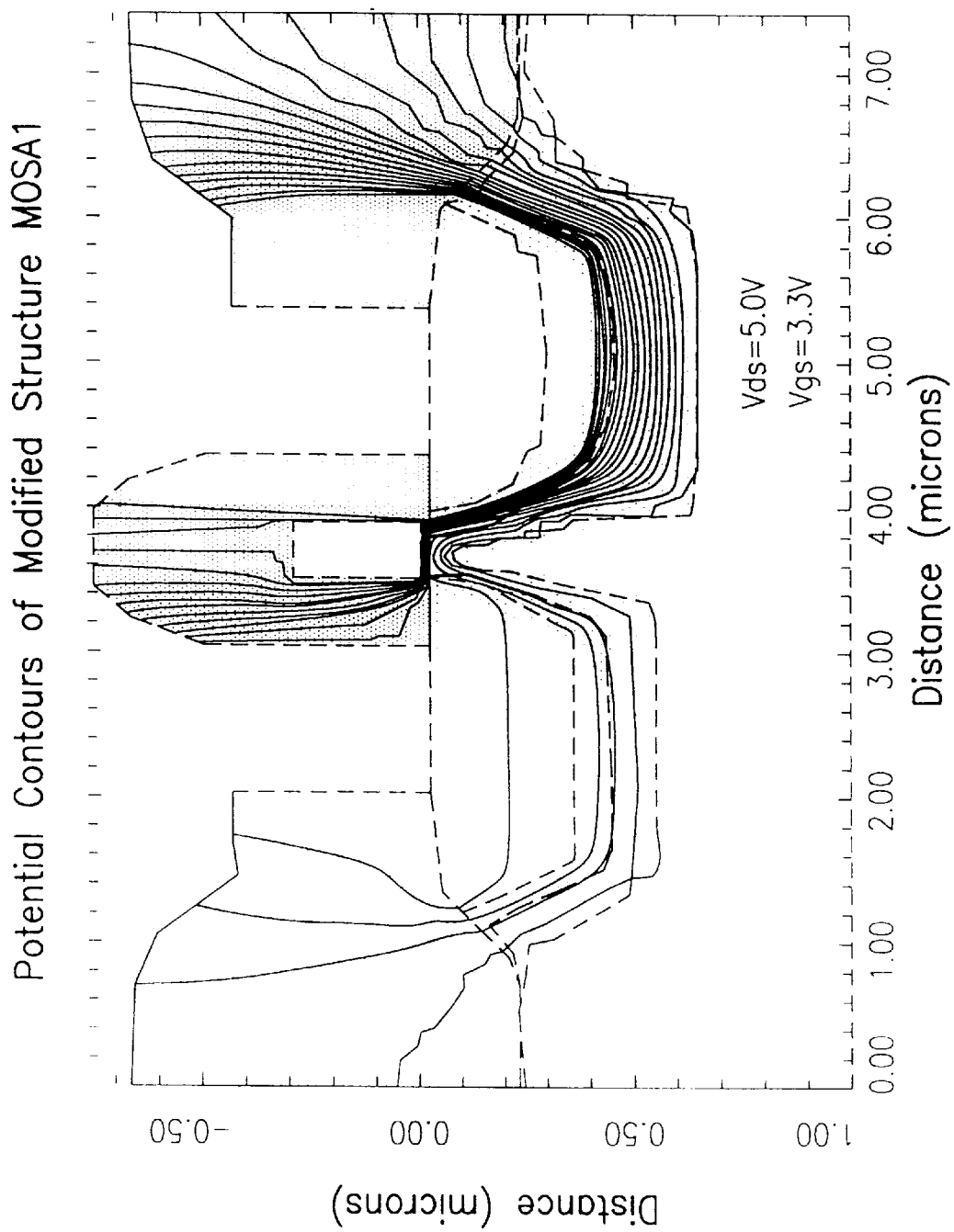

Furthermore, when a 5 voltage is applied between a drain and source and a 3.3 voltage is applied between a gate and the source on the conventional well region device and the device having an inverse T-shaped well region according to the invention, respectively, the electric field distributions of both are shown in FIGS. 14A and 14B, individually. Clearly, the inside of the conventional well region device has denser electric field lines from the comparison between FIGS. 14A and 14B. That is, the conventional well region device has a stronger electric field intensity than the structure of the invention, easily causing the hot electron effect.

Figure 15A:
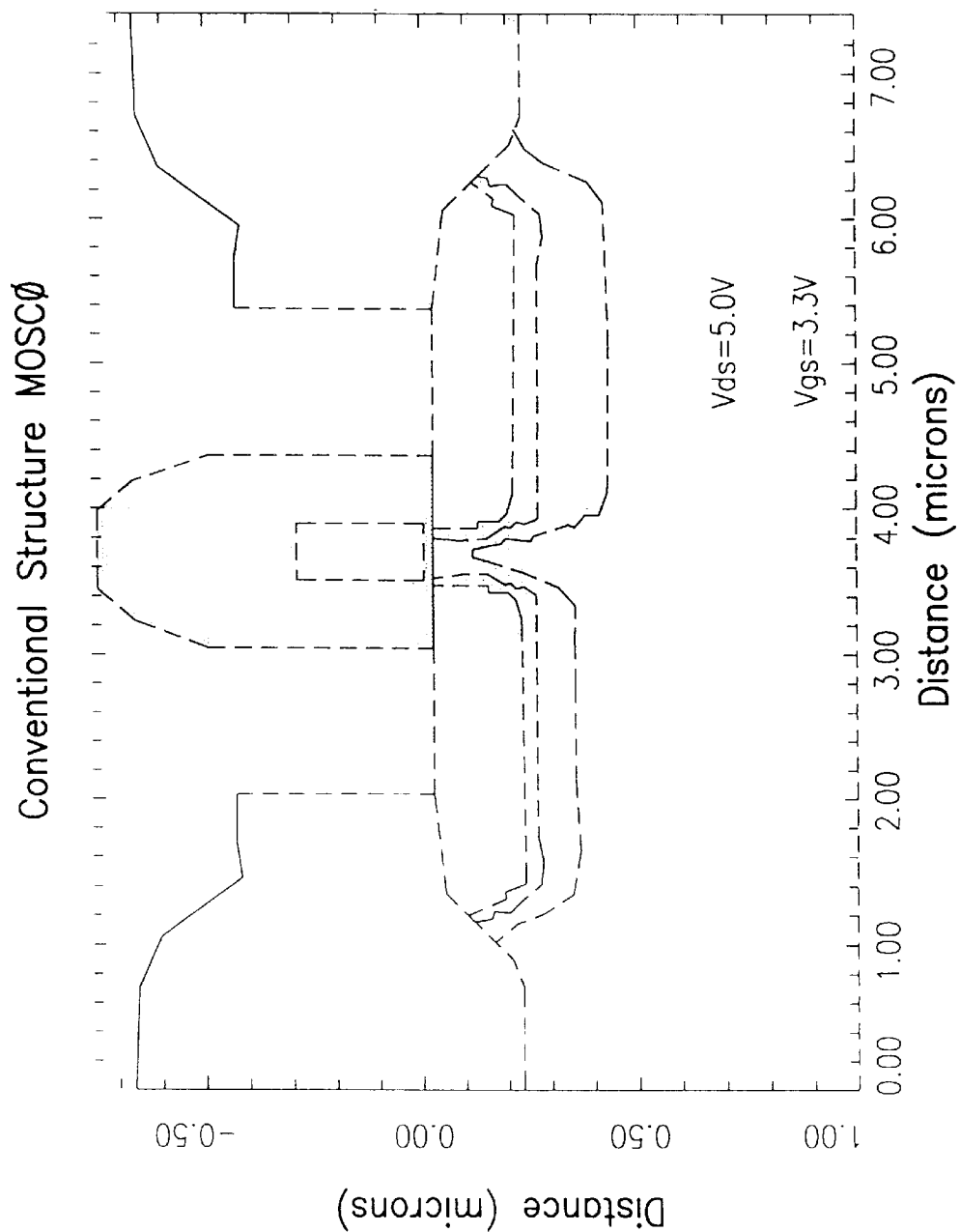
Figure 15B:
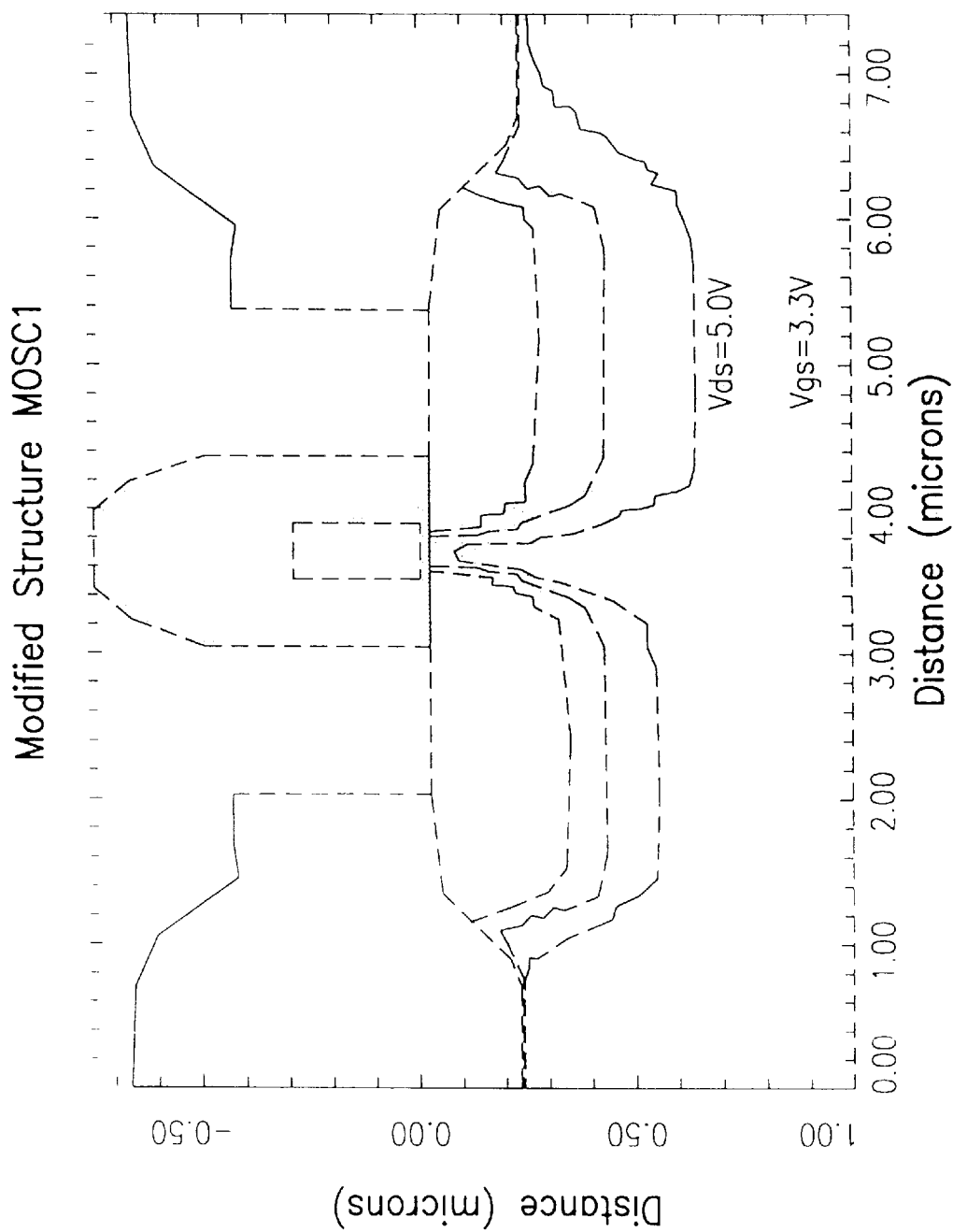

FIGS. 15A and 15B illustrate the depletion capacitance distributions under the above-mentioned bias states on the conventional well region device and the device having an inverse T-shaped well region according to the invention. As shown in FIG. 15A, the line density of the conventional structure is high. That is, the capacitance of the conventional structure is greater. Since the structure of the invention can efficiently reduce overlapped parts among the gate, source and drain, the capacitance among the electrodes can be decreased. Moreover, a first doped region formed by high-energy implantation is located under the drain and source to greatly increase the p-n junctions among the source, drain and well region, such that the parasitic capacitance can be further reduced.

Figure 16A:
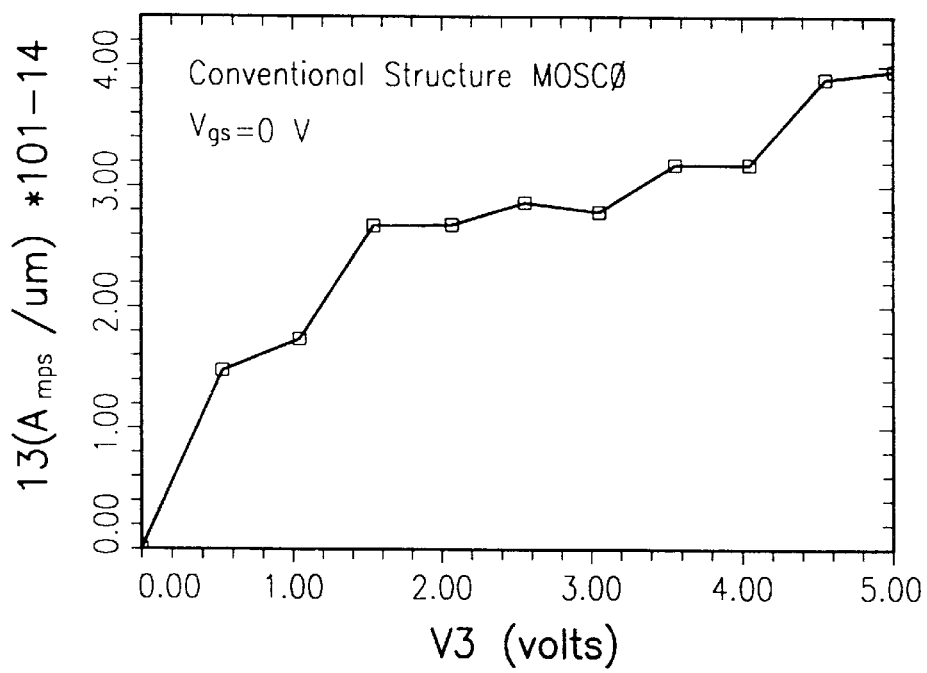
Figure 16B:
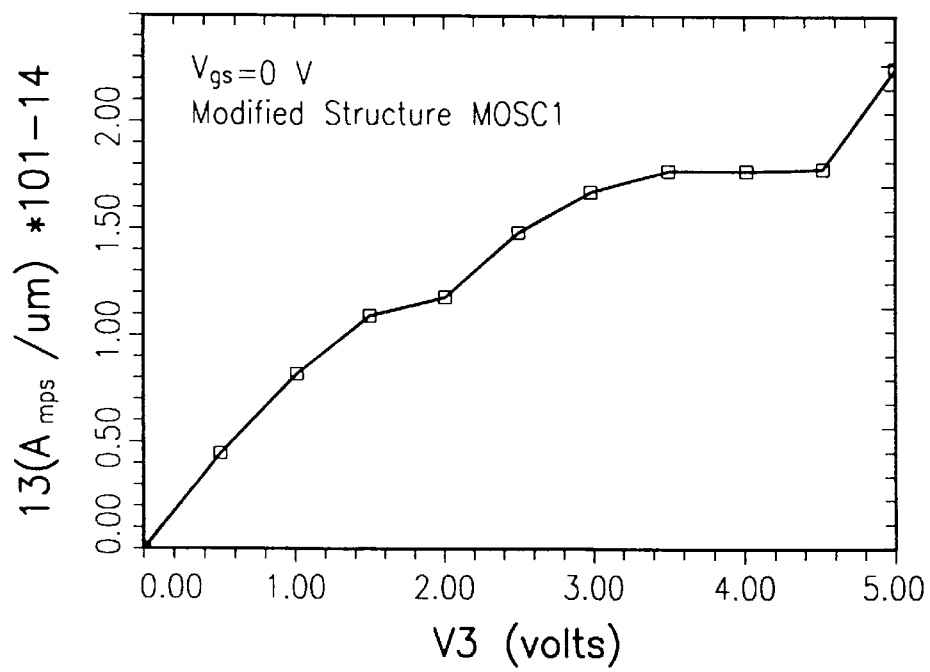

The results of leakage current tests performed for the conventional well region device and the device having an inverse T-shaped well region are described in FIGS. 16A and 16B, respectively. Since the inverse T-shaped well region structure of the invention can efficiently reduce the overlapping parts among the gate, drain and source, the leakage current caused by the overlapping parts can be decreased, thereby attaining an effect like that at a shallow junction structure.

Figure 17A:
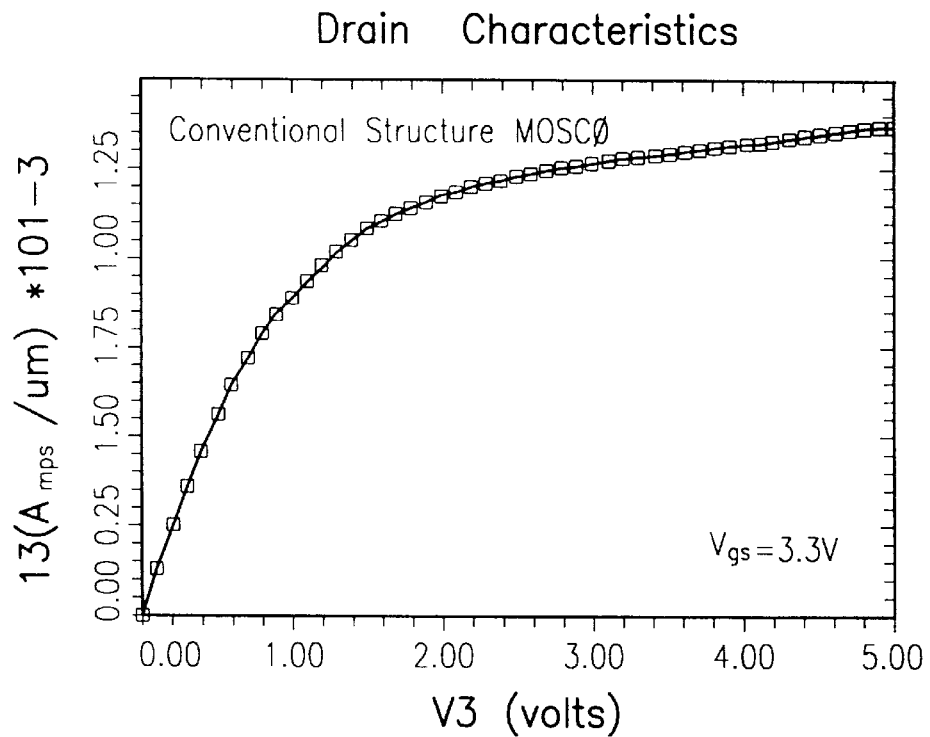
Figure 17B:
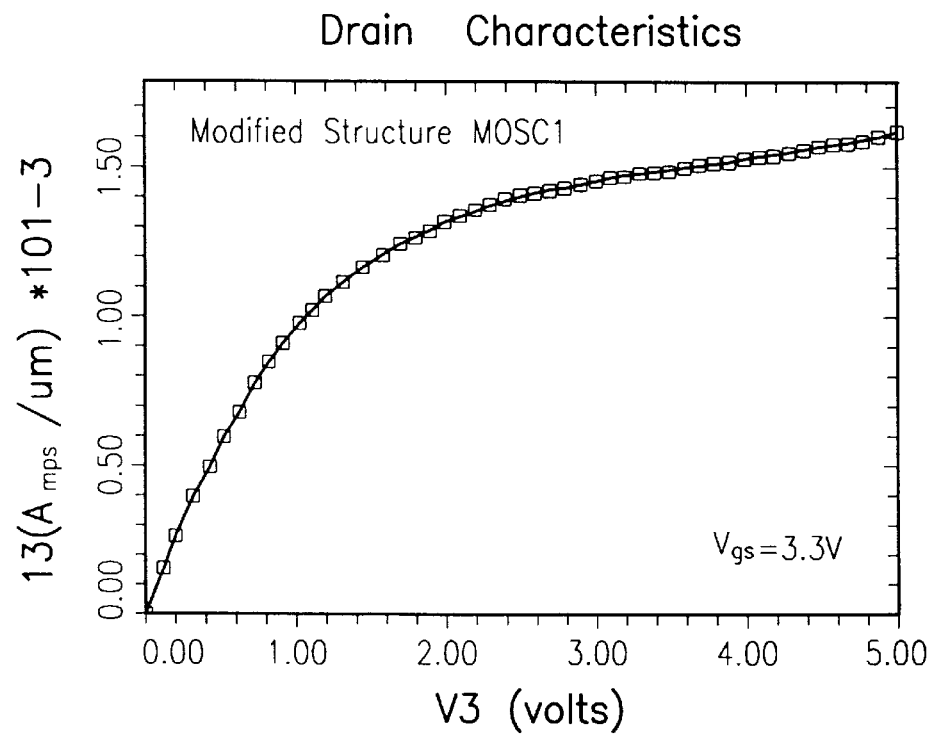

Next, FIGS. 17A and 17B illustrate the comparison in channel saturation current between the conventional well region device and the device having an inverse T-shaped well region, wherein the gates are supplied with a 3.3 voltage.

Figure 18A:
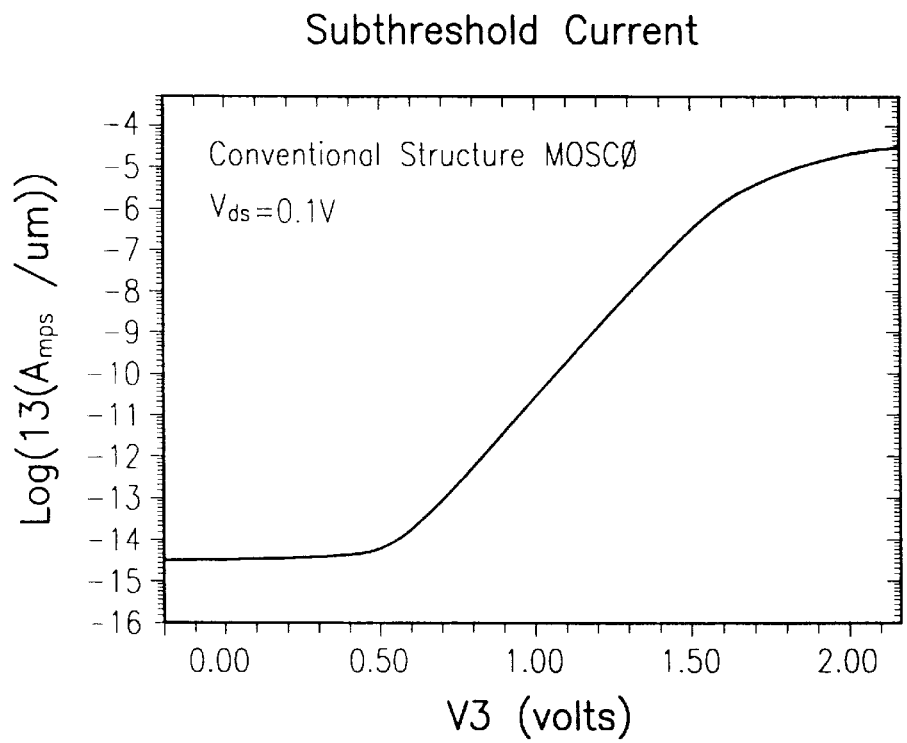
Figure 18B:
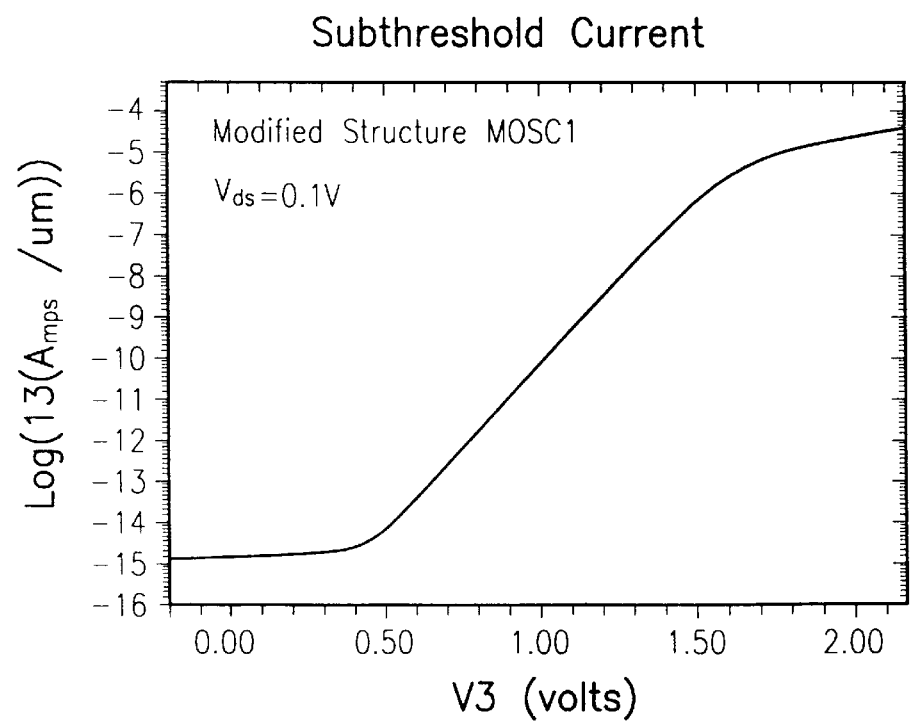

Finally, since the structure of the invention has a lower impurity concentration under the gate, it has lower sub-threshold swing as shown in FIG. 18A and FIG. 18B.

Based on the described analysis above, since there is a counter electric field in the device of the invention, carriers generated on the emitter of a parasitic transistor, which are affected by the counter electric field, cannot reach the collector. Therefore, the gain of the device is reduced.

Figure 19:
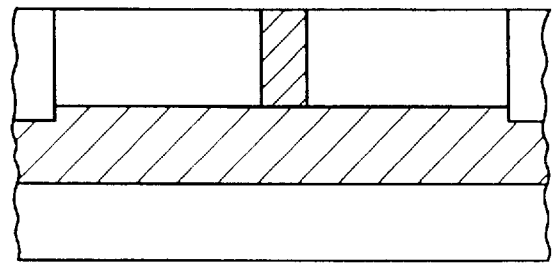
FIG. 19 is a cross-sectional view according to a second embodiment of the invention.

In the previous embodiment, the field oxide layers are used for defining the device regions. However, trenches can also be used instead of the field oxide layers to attain the same results as shown in FIG. 19. If the field oxide layers are used for definition, the peak of the impurity concentration of the first doped region should preferably be located under the field oxide layers. Consequently, the position of the first doped region depends on the thickness of the field oxide layers. If trenches are utilized to define the device regions, the peak of the impurity concentration of the first doped region must be located under the trench, and may be slightly shallow.

Moreover, a twin-well region structure also can be fabricated by a method for manufacturing devices having inverse T-shaped well regions. When forming an N-type inverse T-shaped well region, a mask is used to cover a subsequently-formed P-type well region; when forming a P-type well region, another mask is used to cover the N-type well region. The sequence depends on the practical situation.

Figure 20:
FIGS. 20 through 22 are cross-sectional views according to a third embodiment of the invention.
Figure 21:
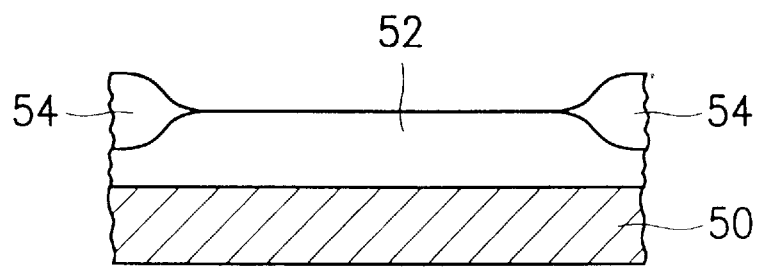
Figure 22:
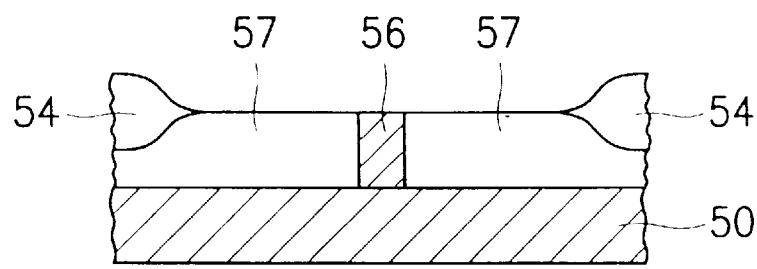

Although the required structure is formed on a substrate by a sequence of two implantations, the device having an inverse T-shaped well region of the invention can also be fabricated by an epitaxial growing process or SOI process. FIGS. 20 through 22 show an epitaxial growing method. As shown in FIG. 20, first, an epitaxial layer 52 is formed on a substrate 50 having a high concentration of impurity, wherein the substrate 50 serves as a first doped region. Next, device regions are defined by LOCOS or trench structures as shown in FIG. 21. Finally, as shown in FIG. 22, a second doped region 56 is formed by an ion-implantation process and by which two third doped regions 57 are spaced.

Figure 23:
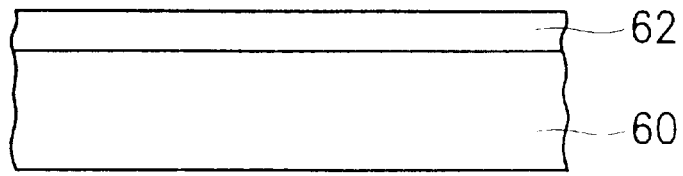
FIGS. 23 through 25 are cross-sectional views according to a fourth embodiment of the invention.
Figure 24:
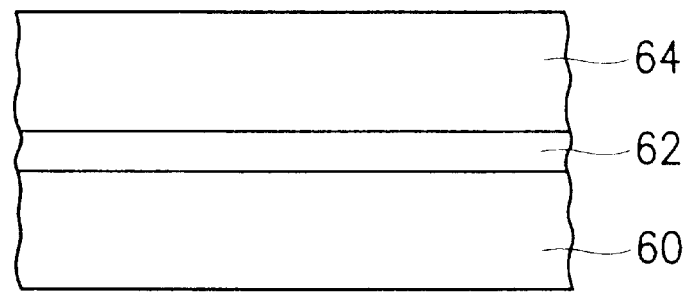
Figure 25:
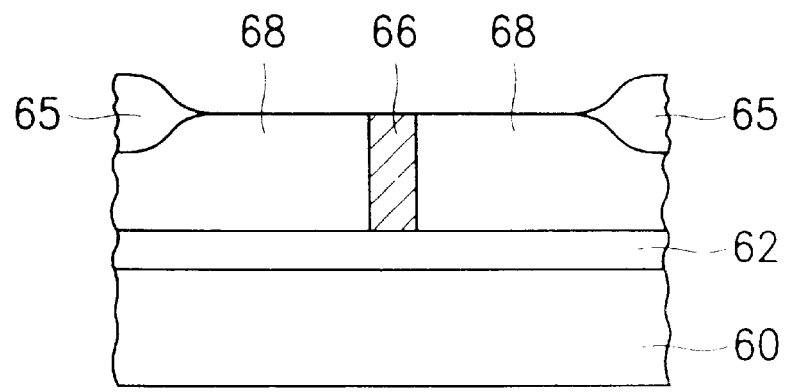

Furthermore, FIGS. 23 through 25 illustrates a method using an SOI structure. First, as shown in FIG. 23, an oxide layer 62 is formed on a substrate 60. Then, a silicon layer 64 is formed on the oxide layer 62 to fabricate an SOI structure as shown in FIG. 24. After that, as shown in FIG. 25, a device region is defined by a LOCOS process or trenches. Then, a second doped region 66 is formed by an ion-implantation process, thereby dividing the silicon layer into two third doped regions 68.

After completing the well structure, a gate oxide layer may be grown by an ECR, RTO, PECVD or conventional furnace treatment. In addition, a polysilicon layer can also be deposited by an ECR, PECVD or LPCVD process. A source and drain can be formed by an SSDD or an LDD process plus an ion-implantation process.

Although the invention has been disclosed in terms of a preferred embodiment, the disclosure is not intended to limit the invention. Those knowledgeable in the art can make modifications within the scope and spirit of the invention which is determined by the claims below.

What is claimed is:

1. A structure for manufacturing devices having inverse T-shaped well regions, which are formed on a substrate, comprising:
    a first doped region formed by ion-implantation in said substrate and kept at a predetermined distance from the surface of said substrate;
    a second doped region formed by ion implantation on said substrate and extending from the surface of said substrate to connect with said first doped region; and
    two third doped regions located between said first doped region and the surface of said substrate and spaced by said second doped region, a source region being formed in one of said third doped regions and a drain region being formed in another one of said third doped regions, wherein the impurity concentrations of said third doped regions are lower than that of said first doped region and that of said second doped region.

2. A structure as claimed in claim 1, further comprising two field oxide layers formed on said substrate to define a device region having an inverse T-shaped well region.

3. A structure as claimed in claim 2, wherein the peak of the impurity distribution of said first doped region is located under said field oxide layers.

4. A structure as claimed in claim 1, further comprising two trenches formed on said substrate to define a device region having an inverse T-shaped well region.

5. A structure as claimed in claim 4, wherein the peak of the impurity distribution of said first doped region is approximately located at the bottoms of said trenches.

6. A structure as claimed in claim 1, further comprising a gate formed above said substrate.

7. A structure for manufacturing devices having inverse T-shaped well regions, which are formed on a substrate, comprising:
    a first doped region formed by ion implantation on said substrate;
    an epitaxial silicon layer formed above said substrate and connected to said first doped region; and
    a second doped region formed by ion implantation, said second doped region punching through said epitaxial silicon layer to connect to said first doped region and separating said epitaxial silicon layer into two third doped regions, a source re ion being formed in one of said third doped regions and a drain region being formed in another one of said third doped regions, wherein the impurity concentrations of said first doped region and said second doped region are higher than that of said epitaxial silicon layer.

8. A structure as claimed in claim 7, further comprising two field oxide layers formed on said epitaxial silicon layer to define a device having an inverse T-shaped well region.

9. A structure as claimed in claim 7, further comprising two trenches formed on said epitaxial silicon layer to define a device having an inverse T-shaped well region.

10. A structure as claimed in claim 3, wherein the first doped region is connected with the field oxide layers.

11. A structure as claimed in claim 5, wherein the first doped region is connected with the trenches.

12. A structure as claimed in claim 8, wherein the first doped region is connected with the field oxide layers.

13. A structure as claimed in claim 9, wherein the first doped region is connected with the trenches.

14. A structure as claimed in claim 6, wherein a gate oxide layer is formed over the second doped region.

15. A structure as claimed in claim 14, wherein a polysilicon layer is formed over the gate oxide layer.

16. A structure as claimed in claim 7, wherein the second doped region and two third doped regions are formed with sufficient depth to provide sufficient contact therebetween to reduce parasitic capacitance.

* * * * *